Figure 2:
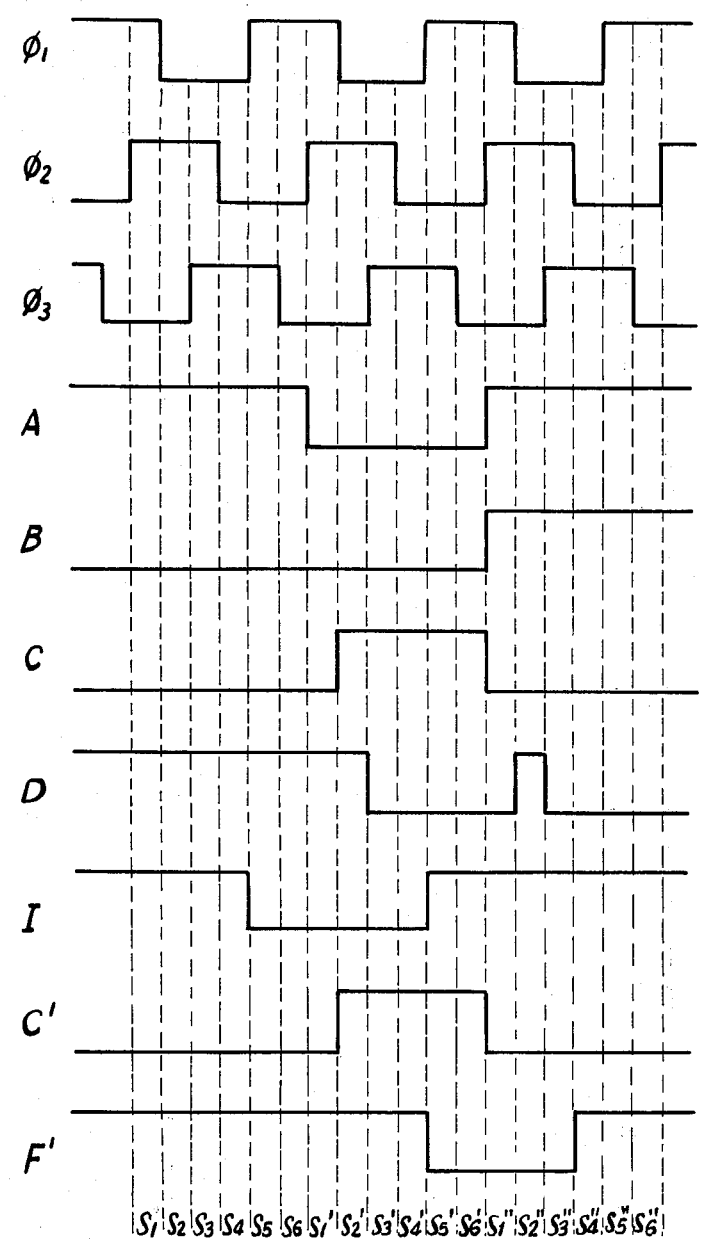

United States Patent [19]

Nakajima

[11] 3,999,081
[45] Dec. 21, 1976

[54] CLOCK-CONTROLLED GATE CIRCUIT

[75] Inventor: Toshio Nakajima, Tokyo, Japan

[73] Assignee: Nippon Electric Co., Ltd., Tokyo, Japan

[22] Filed: Aug. 5, 1975

[21] Appl. No.: 602,115

[30] Foreign Application Priority Data

Aug. 9, 1974 Japan .............................. 49-91302
Oct. 29, 1974 Japan ............................ 49-124628

[52] U.S. Cl. ............................... 307/205; 307/208; 307/214; 307/215

[51] Int. Cl.² ................. H03K 19/08; H03K 19/34; H03K 19/36; H03K 19/40

[58] Field of Search .......... 307/205, 214, 213, 215, 307/269, 208, 221 R, 221 C, 246

[56] References Cited

UNITED STATES PATENTS

| 3,518,451 | 6/1970 | Booher ........................... 307/205 X |
| 3,551,692 | 12/1970 | Yen ..................................... 307/205 |
| 3,601,627 | 8/1971 | Booher ............................... 307/205 |
| 3,631,261 | 12/1971 | Heimbigner .................... 307/205 X |
| 3,798,617 | 3/1974 | Varadi ............................ 307/205 X |
| 3,829,710 | 8/1974 | Hirasawa et al. .................. 307/205 |

OTHER PUBLICATIONS

Yen, "Computer–Aided Test Generation for Four–Phase MOS LSI Circuits", IEEE Trans. on Computers, vol. C–18, No. 10, pp. 890–894, 10/1969.
Nomiya et al., Def. Pub. Search Copy of Serial No. 381,484, filed July 23, 1973, published in 926 O.G. 9, on Sept. 3, 1974, Def. Pub. No. T926,003.

Primary Examiner—John S. Heyman
Assistant Examiner—Larry N. Anagnos
Attorney, Agent, or Firm—Hopgood, Calimafde, Kalil, Blaustein & Lieberman

[57] ABSTRACT

A clock-controlled gate circuit employs field-effect transistors of both n- and p-type conductivities. The circuit includes a precharge circuit, a logic circuit, and a switching transistor serially connected in that order between a power source and ground and a capacitor is connected to the junction between the precharge circuit and the logic circuit.

9 Claims, 17 Drawing Figures

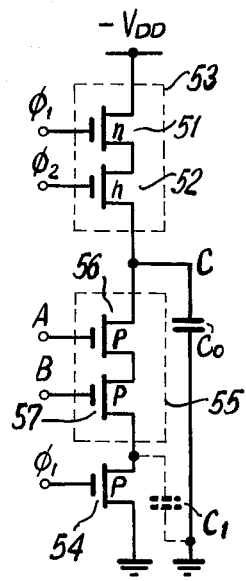
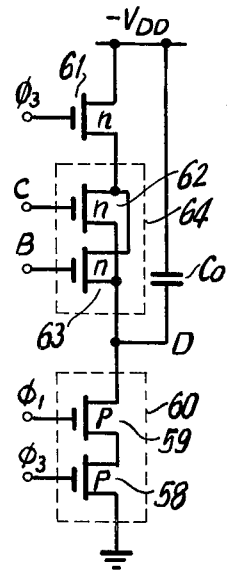
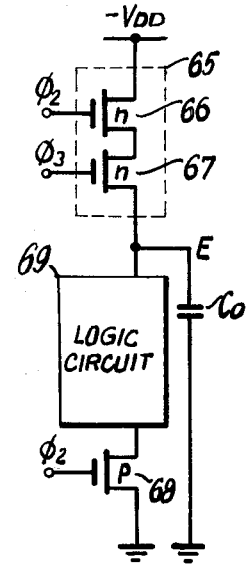
FIG.1a   FIG.1b   FIG.1c
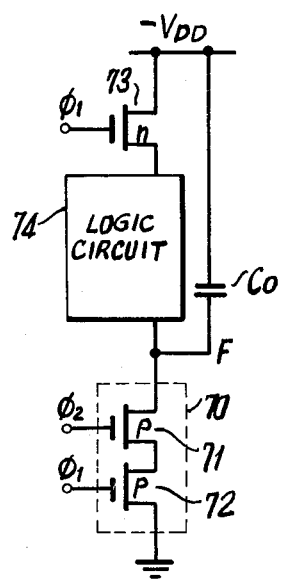
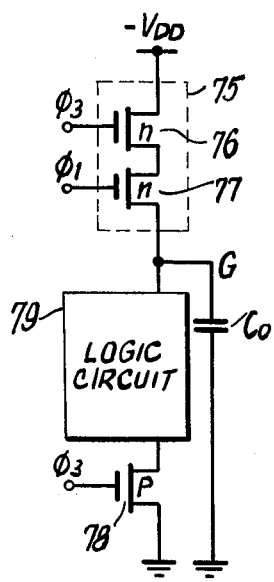
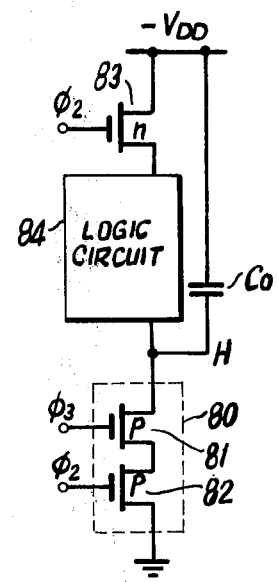
FIG.1d   FIG.1e   FIG.1f

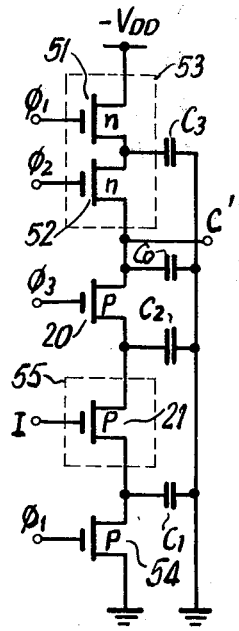
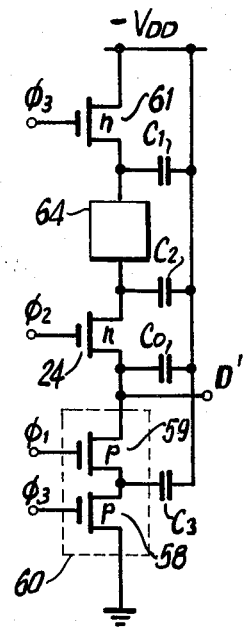
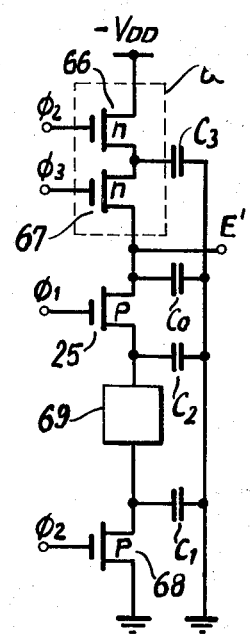
FIG.3a₁     FIG.3b₁     FIG.3c₁
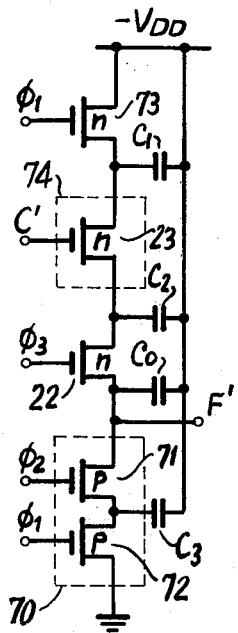
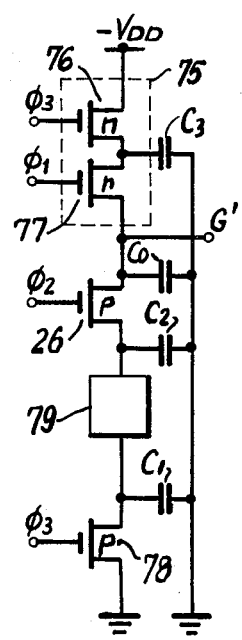
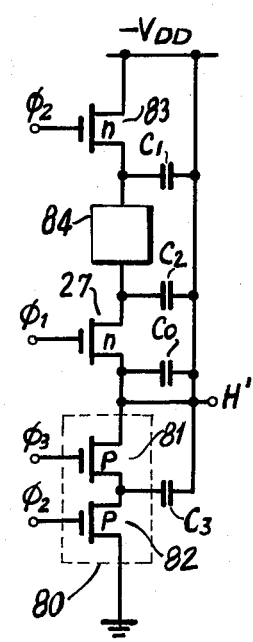
FIG.3d₁     FIG.3e₁     FIG.3f₁

CLOCK-CONTROLLED GATE CIRCUIT

The present invention relates generally to clock-controlled gate circuits, and more particularly to a clock-controlled gate circuit employing insulated-gate field effect transistors (or briefly, IGFETs) of n- and p-conductivity types operated under the control of clock signals.

Clock-controlled gate circuits operate without the need for DC current paths from the power source and thus consume only a relatively small amount of power needed to charge and discharge the capacitors connected to the junctions between the FETs. This has made it possible to design gate circuits that can be operated with little power. A clock-controlled gate circuit, however, normally needs a precharging period for precharging the capacitors, a sampling period for discharging the precharged potentials according to the result of a logic operation, and a holding period for holding the result of a logic operation irrespective of the input signals, with the result that a definite length of time is required for each logic operation. More specifically, the number of stages of gate circuits which can be controlled for the period of one bit of a clock signal is limited, and hence an extra length of time must be assigned to an additional gate stage provided for the desired logic operation. An extra length of time is also necessary to organize an adequate combination of operation timings in order to prevent the operation of the subsequent stages from being affected by the operation of the precharging and sampling stages. The attaining of the necessary control of has required complicated circuit designs.

Clock-controlled gate circuits using multiphase clock signals such as 4-phase or 6-phase are known. In this type of gate circuit, the number of gate circuit stages operable for one bit period is the same as the maximum number of clock signals used. Hence, for circuits in which time delay is not allowed, design freedom is very limited, whereas for circuits having many inputs and intricate interconnections, a number of extra gate circuits must be provided in order to make the input time delays coincident with each other. In other words, the freedom of interconnections between gate circuits can be increased but only at the sacrifice of the need for an increased number of clock signals. In designing integrated circuits, a greater number of clock signals used, requires a greater effort to provide an extra space for the additional gate circuits.

It is therefore a general object of the invention to provide a clock-controlled gate circuit which can be designed with greater freedom and which is constituted of a variety of circuit combinations with a minimum number of clock signals.

The clock-controlled gate circuit of the invention comprises a precharge circuit having a plurality of serially connected IGFETs of a first conductivity type, to which individual clock signals in different phases are applied to their gate electrodes. The circuit further includes a logic circuit having IGFETs a switching IGFET of a second conductivity type, to which one of the clock signals applied to the precharge circuit and is applied to its gate electrode, capacitors.

In the clock-controlled gate circuit of the invention the precharge circuit, the logic circuit, and the switching IGFET are connected in series in this order between a power source and ground, and the capacitor is connected to the junction between the precharge circuit and the logic circuit. For example, two clock signals may be used to control precharge, and one of these clock signals is used to control the holding of the output of the logic circuit. Thus the capacitor is precharged for the period for which the two clock signals are of the same polarity. Sampling is performed by the hold controlling clock signal according to the input applied to the logic circuit, when the switching transistor is in the on state. When the switching transistor is in the off state, the output of the logic circuit is held in the capacitor.

Figure 4:
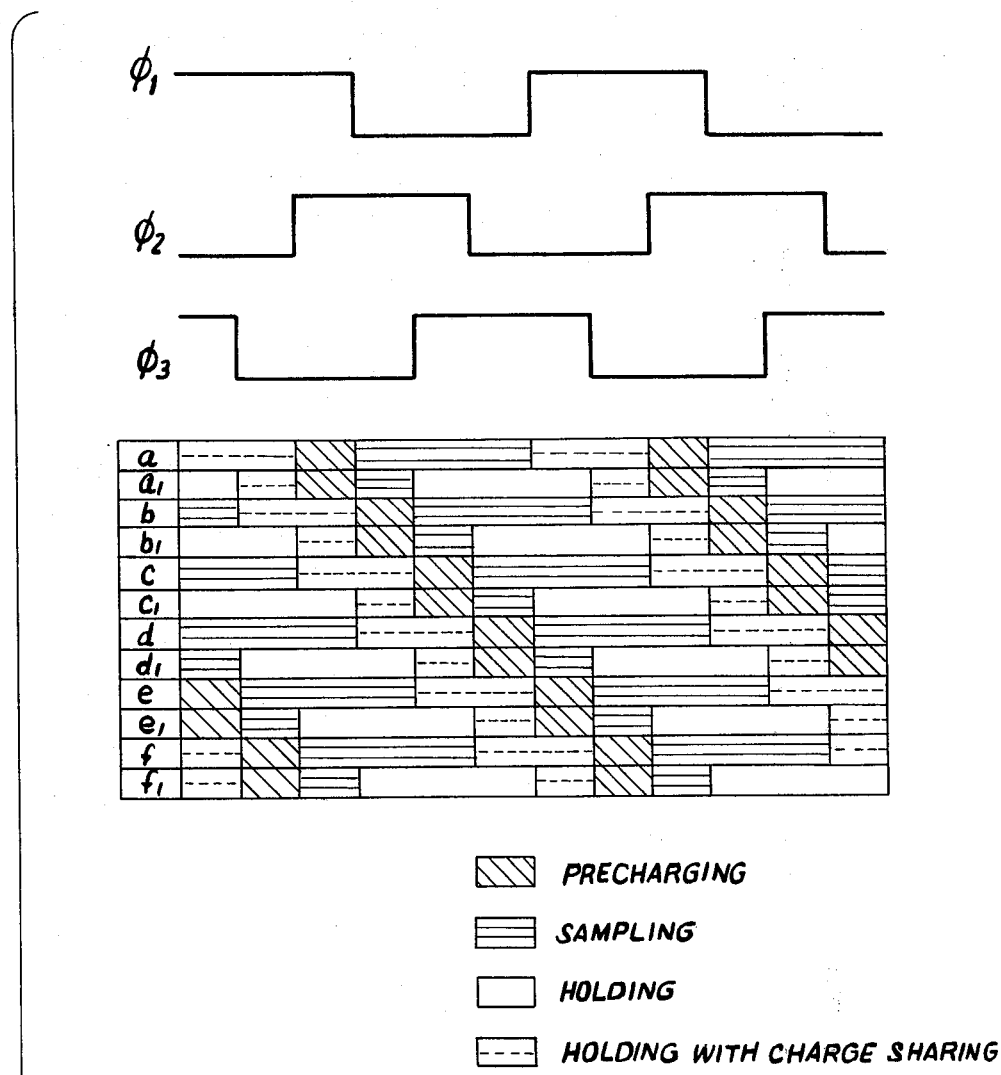

The other objects, features and advantages of the invention will become more apparent from the following description when read with reference to the accompanying drawings, wherein:

FIGS. 1 (a) through 1(f) are circuit diagrams illustrating a clock-controlled gate circuit according to an embodiment of the invention, FIG. 2 is a diagram showing waveforms of clock signals used for the gate circuit and of input and output signals used for the logic circuit of FIG. 1, FIG. 3($a_1$) through 3($f_1$) are circuit diagrams for illustrating gate circuits according to another embodiment of the invention, FIG. 4 is a diagram showing the operation timings for the gate circuits of FIGS. 1 and 3, and FIGS. 5(A) through 5(C) are diagrams showing the available connections for the gate circuits of FIGS. 1 and 3.

For the sake of illustration, the embodiments of the invention herein specifically described employ metal-oxide-semiconductor field effect transistors (briefly, MOS FETs) which are typical of IGFETs.

FIG. 1(a), illustrates a gate circuit which includes a precharge circuit 53 having n-type MOS FETs 51 and 52 connected in series. These FETs are supplied with clock signals $\phi_1$ and $\phi_2$ respectively at their gate electrodes. A switching p-type MOS FET 54 operates under the control of clock signal $\phi_1$ applied to its gate electrode and determines the sampling period. A logic circuit 55 comprising p-type MOS FETs 56 and 57 is provided between the precharge circuit 53 and the switching MOS FET 54. The potential at the junction C between the precharge circuit 53 and the logic circuit 55 is derived as a logic output, and a capacitor Co for holding charges is installed at this output. In FIG. 1(a), the two p-type MOS FETs 56 and 57 of logic circuit 55 are connected in series to operate as a two-input (A, B) NAND circuit. The precharge circuit 53, the logic circuit 55 and the switching MOS FET 54 are connected in series in this order between a power source -$V_{DD}$ and ground. The operation of this circuit will be described by referring to FIG. 2.

Assume that the n-type MOS FETs turn on at 0 volt (high level); and the p-type MOS FETs turn on at -$V_{DD}$ volt (low level). The precharge circuit 53 turns on only when both clock signals $\phi_1$ and $\phi_2$ are at the high level to charge the capacitor Co to the potential -$V_{DD}$. This operation is effected for the periods $S_1$, $S_1'$ and $S_1'$ $_{and}$ $_{S1}''$ shown in FIG. 2. The logic circuit 55 turns on only when both inputs A and B are at the low level. The switching MOS FET 54 turns on for the periods $S_2$, $S_3, S_4, S_2', S_3', S_4', S_2'', S_3''$ and $S_4''$ for which the clock signal $\phi_1$ assumes the low level. Sampling is performed for these periods. For the periods $S_5$, $S_6$, $S_5'$, $S_6'$, $S_5''$ and $S_6''$ the precharge circuit 53 and the switching MOS FET 54 are nonconducting and the output C is held irrespective of the logic inputs A and B. For the periods $S_2'$, $S_3'$ and $S_4'$ for which both inputs A and B are at the low level, the precharged potential is released during the sampling period, causing the output C to assume the high level. This high level potential is held until the succeeding periods $S_5'$ and $S_6'$. For the other sampling periods $S_2$, $S_3$, $S_4$, $S_2''$, $S_3''$ and $S_4''$, the logic circuit 55 remains nonconducting and hence the precharged potential is not released and the output C is at the low level. This low level output is maintained for the following holding periods $S_5$, $S_6$, $S_5''$ and $S_6''$. In this manner, the logic output is derived as the potential at the output C for the sampling and holding periods in the circuit of FIG. 1(a). the timings for this operation are shown in FIG. 4(a).

The circuit arrangement of the invention shown in FIG. 1(b) comprises MOS FETs of conductivity types reverse to those shown in the gate circuit of FIG. 1(a). A precharge circuit 60 has p-type MOS FETs 58 and 59 connected in series, and have precharge controlling clock signals $\phi_3$ and $\phi_1$ respectively applied to their gate electrodes. The clock signal $\phi_3$ is applied to the gate electrode of a switching n-type MOS FET 61 which determined the sampling period. A logic circuit 64 comprising n-type MOS FETs 62 and 63 is provided between the precharge circuit 60 and the switching MOS FET 61. The potential at the junction D between the logic circuit 64 and the precharge circuit 60 is derived as the logic output. A charge holding capacitor Co is connected to the junction D. The switching MOS FET 61, the logic circuit 64 and the precharge circuit 60 are connected in series in this order between a power source -$V_{DD}$ ground. In this example, the logic circuit 64 is of two-input NOR circuit having n-type MOS FETs 62 and 63 connected in parallel. The inputs to the logic circuit are the signal B of FIG. 2 and the output C of FIG. 1(a). The precharge circuit 60 turns on only when both clock signals $\phi_3$ and $\phi_1$ are at the low level, to precharge the capacitor Co with a positive potential. This operation is effected for the periods $S_2$, $S_2'$ and $S_2''$. The logic circuit 64 is nonconductingonly when both inputs B and C are at the low level. The switching MOS FET 61 turns on for the periods $S_3$, $S_4$, $S_5$, $S_3'$, $S_5'$, $S_3''$, $S_4''$ and $S_4''$ for which the clock signal $\phi_3$ assumes the high level. Sampling is performed for these periods. For the periods $S_1$, $S_6$, $S_1'$, $S_6'$. $S_1''$ and $S_6''$, both the precharge circuit 60 and the switching MOS FET 61 are nonconducting, and the output D is held. As can be seen in FIG. 2, the precharged potential is released to cause the output D to assume the low level during the sampling period. This operation is effected for the periods $S_3'$, $S_4'$, $S_5'$ $S_3''$, $S_4''$ and $S_5''$ for which at least one of the inputs B and C assumes the high level. This low level output D is held until the succeeding periods $S_6'$, and $S_1''$ and $S_6''$. For the sampling periods $S_3$, $S_4$ and $S_5$, the logic circuit 64 is non-conducting and hence the precharged potential is not released and the output D is at the high level. This high level output D remains for the succeeding periods $S_6$ and $S_1'$. Thus, in the circuit of FIG. 1(b), the logic output is derived as the potential at the output D during the sampling and holding periods. The timings for this operation are shown in FIg. 4(b).

Referring to FIG. 1(c), a circuit is shown comprising MOS FETs of the same conductivity types as those shown in FIG. 1(a). A precharge circuit 65 comprises a series circuit of n-type MOS FETs 66 and 67, which have their gate electrodes supplied with precharge controlling clock signals $\phi_2$ and $\phi_3$ respectively. The clock signal $\phi_2$ is applied to the gate electrode of a switching p-type MOS FET 68 which determines the sampling period. A logic circuit 69 consisting of p-type (not shown) is provided between the precharge circuit 65 and the switching MOS FET 68. The potential at the junction E between the precharge circuit 65 and the logic circuit 69 is derived as the logic output. A charge holding capacitor Co is connected to the junction E. The precharge circuit 65, the logic circuit 69 and the switching MOS FET 68 are connected in series in this order between a power source -$V_{DD}$ and ground. This circuit operates at the timings shown in FIG. 4(c).

The circuit shown in FIG. 1(d) comprises MOS FETs of the same conductivity types as those shown in FIg. 1(b). A precharge circuit 70 comprises a series circuit of p-type MOS FETs 71 and 72, which have their gate electrodes supplied with precharge controlling clock signals $\phi_2$ and $\phi_1$ respectively. The clock signal $\phi_1$ is applied to the gate electrode of an n-type MOS FET 73. A logic circuit 74 consisting of n-type MOSFETs (not shown) is provided between the precharge circuit 70 and the switching MOS FET 73. The potential at the junction F between the precharge circuit 70 and the logic circuit 74 is derived as the logic output. A charge holding capacitor Co is connected to the junction F. The switching MOS FET 73, the logic circuit 74 and the precharge circuit 70 are connected in series in this order between a power source -$V_{DD}$ and ground. This circuit operates at the timings shown in FIG. 4(d). The circuit illustrated in FIG. 1(e) comprises MOSFETs of the same conductivity types as those shown in FIG. 1(a). A precharge circuit 75 comprises a series circuit of n-type MOSFETs 76 and 77, which have their gate electrodes supplied with gate controlling clock signals $\phi_3$ and $\phi_1$ respectively. The clock signal $\phi_3$ is applied to the gate electrode of a p-type MOS FET 78. A logic circuit 79 consisting of p-type MOSFETs (not shown) is provided between the precharge circuit 75 and the switching MOS FET 78. The potential at the junction G between the precharge circuit 75 and the logic circuit 79 is derived as the logic output. A charge holding capacitor Co is connected to the junction G. The precharge circuit 75, the logic circuit 79 and the switching MOS FET 78 are connected in series in this order between a power source -$V_{DD}$ and ground. This circuit operates at the timings shown in FIg. 4(e). The circuit of FIG. 1(f) comprises MOSFETs of the same conductivity types as those shown in FIG. 1(b). This circuit includes a precharge circuit 80 comprising a series circuit of p-type MOSFETS 81 and 82, which have their gate electrodes supplied with precharge controlling clock signals $\phi_3$ and $\phi_2$ respectively. The clock signal $\phi_2$ is applied to the gate electrode of an n-type MOS FET 83 which determines the sampling period. A logic circuit 84 consisting of n-type MOSFETS (not shown) is provided between the precharge circuit 80 and the switching MOS FET 83. The potential at the junction H between the precharge circuit 80 and the logic circuit 84 is derived as the logic input. A charge holding capacitor Co is connected to the junction H. The switching MOS FET 83, the logic circuit 84 and the precharge circuit 80 are connected in series in this order between a power source -$V_{DD}$ and ground. This circuit operates at the timings shown in FIg. 4(f).

The periods in FIG. 4 correspond respectively to the periods $S_1$ through $S_6''$ in FIG. 2. FIG. 4 signifies the fact that the gate circuit of the invention is able to perform logic operations at 6 kinds of timing as shown in FIG. 1(a) through (f) by the use of only three kinds of clock signals $\phi_1$, $\phi_2$ and $\phi_3$, thus markedly enhancing design freedom. Because the gate circuit of the invention can operate with a minimum number of different clock signals, the area occupied by constituent elements on an integrated circuit can be minimized. Furthermore, the current for charging and discharging the capacitor which is connected to the logic output terminal is in the same direction as the grounded-source current for both the n-type and p-type MOSFETs and hence a logic output of full amplitude having no offset voltage against the power source and ground can be obtained at the output terminal. This function of the circuit is particularly useful when the circuit is operated under the application of a low voltage. In the disclosed embodiment, three-phase clock signals are used. Instead, a two-phase, a four-phase or other multiphase clock signal may be used for the purpose of the invention. The maximum number of kinds of gate circuits available is twice the number of different clock signals used. The gate circuit of the invention may be driven by specific clock pulses instead of power source and ground potentials.

In the foregoing embodiment, there inevitably exists a parasitic capacitance between the logic circuit and the switching MOS FET. This parasitic capacitance affects the logic output level of the gate circuit. In the circuit of FIG. 1(a), a parasitic capacitance $C_1$ is present at the junction between the logic circuit 55 and the switching MOS FET 54. During the precharging period, the capacitor Co is charged with a negative power source potential $-V_{DD}$, or stands at the low level. If the inputs A and B to the logic circuit 55 are both at the high level during the subsequent sampling period, the logic output C remains at the low level because the capacitor Co maintains its charged potential. For the subsequent holding period where the MOS FET 54 is nonconducting, both MOSFETs 56 and 57 turn on if both inputs A and B assume the low level. As a result, part of the negative charge stored in the capacitor Co moves to the parasitic capacitance $C_1$ through the logic circuit 55, causing charge sharing. Therefore the potential at the output C changes to a value expressed by $(C_o/C_1 + C_o)$ $(-V_{DD})$. In other words, the level of the output C changes during the holding period, with the result that the operation of the subsequent stage is affected depending on the value of capacitance $C_1$. This problem also is involved in the circuits (b) through (f) in FIG. 1. In the timing chart of FIG. 4, therefore, the holding period includes the period of charge sharing.

The gate circuits illustrated in FIGS. 3($a_1$) through 3($f_1$) operate free of the charge sharing problem encountered in the circuits of FIG. 1. Like constituent elements of these gate circuits are indicated by the identical references in FIGS. 1 and 3. In the circuit shown in FIG. 3($a_1$), which is a modification of the one shown in FIG. 1(a), a hold controlling p-type MOS FET 20 is connected between a precharge circuit 53 and a logic circuit 55, and a clock signal $\phi_3$ is applied to the gate electrode of the MOS FET 20. For explanatory simplicity, the logic circuit 55 in FIG. 3($a_1$) is shown as an inverter circuit comprising a p-type MOS FET 21. A charge holding capacitor Co is connected to the junction between the precharge circuit 53 and the p-type MOS FET 20, and the potential at this junction is derived as the logic output C'. Parasitic capacitances $C_1$, $C_2$ and $C_3$ are formed respectively between the junction of MOS FETs 54 and 21 and ground, between the junction of MOS FETs 21 and 20 and ground, and between the junction of MOSFETs 51 and 52 and ground. The operation of this circuit will be described by referring to FIG. 2.

A waveform I is applied as a logic input to the gate electrode of the MOS FET 21 which operates as an inverter, i.e., the logic circuit 55. Precharging is preformed for the periods $S_1$, $S_1'$, and $S_1''$ for which both clock signals $\phi_1$ and $\phi_2$ are at the high level. In this state, the clock signal $\phi_3$ is at the low level so that the p-type MOS FET 20 is conducting, causing capacitances $C_0$, $C_2$ and $C_3$ to be negatively charged. When the input I is at the low level, the capacitance $C_1$ also is precharged, whereas, when the input I is at the high level, the capacitance $C_1$ is not precharged. Sampling is performed for the periods $S_2$, $S_2'$ and $S_2''$ for which both p-type MOS FETs 54 and 20 are conducting. In this state, the n-type MOS FET 52 also is conducting. Thus, when the input I is at the low level and the logic circuit 55 is conducting, the negative potentials precharged across the capacitances $C_3$, $C_0$ and $C_2$ are released through the logic circuit 55, causing the output C' to assume the high level. When the input I is at the high level, the negative potentials at the capacitances $C_3$, $C_0$ and $C_2$ remain unreleased. For the periods $S_3$ through $S_5$, $S_3'$ through $S_5'$, and $S_3''$ through $S_5''$, the p-type MOS FET 20 becomes nonconducting and the output terminal C' is disconnected from the logic circuit 55. In this state, if the input I changes its level from high to low, the charge across the capacitance $C_2$ goes to the capacitance $C_1$, but the charge across the capacitance $C_0$ remains unchanged. For the first periods of the precharging sampling and holding periods, i.e., for the periods $S_1$ through $S_3$, $S_1'$ through $S_3$, $S_1''$ through $S_3''$, the n-type MOS FET 52 is conducting, and precharging is effected on the capacitance $C_3$ concurrently with the capacitance $C_0$. For other periods, the n-type MOS FET 52 is nonconducting, and the capacitances $C_3$ and $C_0$ are disconnected from each other. As a result, the charge across the capacitance $C_0$ does not move to the capacitance $C_3$ during the holding period. For the periods $S_6$, $S_6'$ and $S_6''$, the charge holding p-type MOS FET turns on. In this state, the sampling p-type MOS FET 54 is still nonconducting. Thus, when the input I is at the low level and the logic circuit 55 is conducting, the charge across the capacitance $C_0$ diverges into the capacitances $C_2$ and $C_1$, thereby causing the potential at the output C' to assume the high level. By repeating a series of these operations, an output waveform C' (FIG. 2) is obtained against the input I. This circuit of FIG. 3($a_1$) operates at the timings shown in FIG. 4($a_1$). The gate circuit shown in FIG. 3($d_1$) comprises MOS FETs of conductivity types opposite to those in the circuit shown in FIG. 3($a_1$). The aim of this circuit is to solve the problem of charge sharing involved in the circuit of FIG. 1(d). In the circuit of FIG. 3($d_1$), a hold controlling n-type MOS FET 22 is connected between a precharge circuit 70 and a logic circuit 74 shown in FIG. 1(d) and is supplied with a clock signal $\phi_3$ at its gate. For explanatory simplicity, the logic circuit 74 is shown as an inverter circuit constituted of an n-type MOS FET 23. A charge holding capacitor $C_0$ is connected to the junction between the precharge circuit 70 and the FET 22, and the potential at this junction is derived as the logic output F'. Capacitances $C_1$, $C_2$ and $C_3$ are formed respectively between the junction of MOS FETs 73 and 23 and power source $-V_{DD}$, between the junction of MOS FETs 22 and 23 and power source $-V_{DD}$, and between the junction of MOS FETs 71 and 72 and power source $-V_{DD}$. The operation of this circuit will be described by referring to FIG. 2.

Assume that the output C' of the circuit of FIg. $3(a_1)$ is applied to the gate of MOS FET 23. For the periods $S_4$, $S_4'$ and $S_4''$ for which the clock signals $\phi_1$ and $\phi_2$ are both at the low level, the capacitances $C_0$ and $C_3$ are precharged with positive potentials. Then, when the input C' is at the high level for the sampling periods $S_5$, $S_5'$ and $S_5''$, the precharged positive potentials are released whereas, when the input C' is at the low level, the precharged potentials are held. For the periods $S_1$, $S_2$, $S_6$ through $S_2'$, $S_6'$ through $S_2''$ and $S_6''$, the n-type MOS FET 22 turns off, and the output F' is held. For the periods $S_3$, $S_3'$ and $S_3''$, the output F' changes due to charge sharing. When the output C' of the circuit of FIG. $3(a_1)$ is applied to the gate circuit of FIG. $3(d_1)$, the periods $S_6$, $S_6'$ and $S_6''$ for which charge sharing takes place in the gate circuit of FIG. $3(a_1)$ correspond to the holding period in the gate circuit of FIG. $3(d_1)$. Hence this operation does not affect the output F' of the circuit of FIG. $3(d_1)$. The waveform F' shown in FIG. 2 is an output waveform derived from the gate circuit of FIG. $3(d_1)$ against the input waveform C'. This circuit operates at the timings shown in FIG. $4(d_1)$.

The circuits $(b_1)$, $(c_1)$, $(e_1)$ and $(f_1)$ in FIG. 3 are designed to be operable free of the problem of charge sharing which is contingent to the circuits $(b)$, $(c)$, $(e)$ and $(f)$ in FIG. 1. In the circuit shown in FIG. 3, an n-type MOS FET 24, a p-type MOS FET 25, a p-type MOS FET 26 and an n-type MOS FET 27 are connected respectively between the precharge circuit and the logic circuit which have the functions described by referring to the corresponding circuits of FIG. 1. Clock signals $\phi_2$, $\phi_1$, $\phi_2$ and $\phi_1$ are applied respectively to these MOSFETs and outputs are derived from the junctions D', E', G' and H' between the logic circuit and the individual MOSFETs 24, 25, 26 and 27. The operating timings of the circuits $(b_1)$, $(c_1)$, $(e_1)$ and $(f_1)$ of FIG. 3 are shown in FIg. $4(b_1)$, $(c_1)$, $(e_1)$ and $(f_1)$ respectively.

Figure 5A:
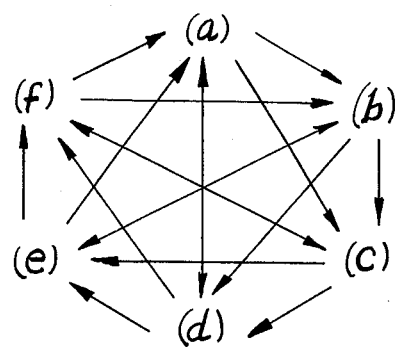
Figure 5B:
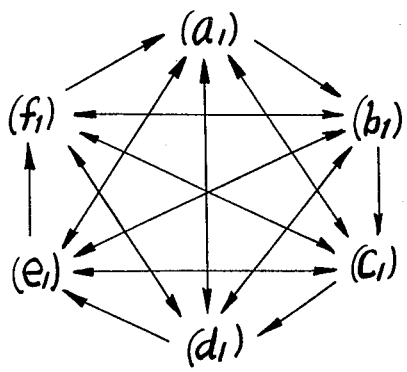

To correctly transmit data from one stage to another in this type of clock-controlled gate circuit, the sampling for the subsequent stage must be performed after the sampling for the previous stage has completely been finished and immediately before the output signal assumes a new level. Moreover, when the sampling for the subsequent stage and the precharging for the previous stage are simultaneously performed, the logic circuit of the subsequent stage must be in an off-state, that is, MOS FETs composing the logic circuit of the subsequent stage must be of a conductivity type opposite to that of the MOSFETs comprising the logic circuit of the previous stage. Therefore, for example, the output of the circuits of FIg. $1(a)$ or of FIG. $3(a_1)$ can be connected to the circuits $(b)$, $(c)$, $(d)$ of FIG. 1 or the circuits $(b_1)$, $(c_1)$, $(d_1)$ or $(e_1)$ of FIG. 3. FIG. 5 (A) shows the directions in which six kinds of gate circuits as in FIGS. $1(a)$ to $1(f)$ can be connected to each other and FIG. 5(B) shows the directions in which six kinds of gate circuits shown in FIGS. $3(a_1)$ to $3(f_1)$ can be connected to each other.

Moreover, the embodiments of the invention shown in FIGS. 1 and 3 may suitably be combined together to set up a variety of gate circuit functions. For example, when the output of the circuit $(a_1)$ in FIG. 3 is connected to the circuit $(b)$ or $(c)$ in FIG. 1, the output of the latter circuit does not change for the holding period of the former circuit because the output of the former circuit remains unchanged for the holding period after sampling. Hence, by supplying the output of the circuit $(b)$ or $(c)$ of FIG. 1 to the circuit $(d_1)$ of FIG. 3, data can be correctly transmitted from one stage to another.

Figure 5C:
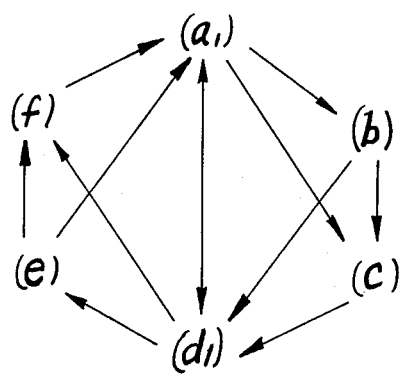

FIG. 5(C) shows the directions in which the gate circuits $(a_1)$ and $(d_1)$ of FIg. 3 can be connected to the gate circuits of $(b)$, $(c)$, $(e)$ and $(f)$ of FIG. 1. Thus circuit design according to the connecting directions shown in FIGS. 5 (B) or 5 (C) will obviate the influence of charge sharing ascribed to parasitic capacitances. Furthermore, the gate circuit of the invention can be operated at six kinds of timing under the control of only three kinds of clock signals. This permits the clock generator and wiring to be simplified, the freedom of connections among gate circuits to be enhanced, and circuit design effort to be minimized. The invention will no doubt contribute much to the achievement of efficient integrated circuits of greater integration.

It is apparent that the invention is not limited to the foregoing specific embodiments but may be utilized in many ways. For example, the period for which at least two clock signals concurrently assume a high or low level is used as the precharging period, and one of the clock signals is used for sampling. The gate circuit of the invention can be operated also by driving the potentials at the power source and ground terminals with a given clock signal.

While a few preferred embodiments of the invention and specific modifications thereof have been described in detail, it is to be understood that numerous variations may occur to those skilled in the art without departing from the true spirit of the invention.

What is claimed is:

1. A circuit comprising a power source having first and second terminals, a first clock-controlled gate circuit having an output node, a capacitor connected to said output node, a precharging circuit including serially connected first and second insulated-gate field effect transistors of a first conductivity type and connected between said first terminal of said power source and said output node, a third insulated-gate field effect transistor of a second conductivity type opposite to said first conductivity type, a source electrode of said third transistor being connected to said second terminal of said power source, a first logic circuit having an input terminal and first and second output terminals, means for connecting said first output terminal of said first logic circuit to said output node, and means for connecting said second output terminal of said first logic circuit to the drain electrode of said third transistor, a second clock-controlled gate circuit having an output node, a capacitor connected to said output node of said second gate circuit, a precharging circit composed of serially connected fourth and fifth insulated-gate field effect transistors of said second conductivity type and connected between said second terminal of said power source and said output node of said second gate circuit, a sixth insulated-gate field effect transistor of said first conductivity type, a source electrode of said sixth transistor being connected to said first terminal of said power source, a second logic circuit having an input terminal and first and second output terminals, said input terminal of said second logic circuit being connected to said output node of said first gate circuit, means for connecting said first output terminal of said second logic circuit to said output node of said second gate circuit, and means for connecting said second output terminal of said second logic circuit to the drain electrode of said sixth transistor, means for applying a first clock signal having a first level at a first, a second and a third period and a second level at a fourth, a fifth and a sixth period, said first lelve being effective to allow an insulated-gate field effect transistor of said first conductivity type to conduct, said second level being effective to allow an insulated-gate field effect transistor of said second conductivity type to conduct to the gate electrodes of said first, third and fifth transistors, means for applying a second clock signal having said first level at said third, fourth, and fifth periods and said second level at said first, second and sixth periods to the gate electrode of said second transistor, and means for applying a third clock signal having said first level at said first, fifth and sixth periods and said second level at said second, third and fourth periods to the gate electrodes of said fourth and sixth transistors.

2. A circuit according to claim 1, wherein said means connecting said first output terminal of said first logic circuit to said output node of said first gate circuit includes a seventh insulated-gate field effect transistor of said second conductivity type, a gate electrode of said seventh transistor being supplied with said third clock signal.

3. A circuit according to claim 1, wherein said means for connecting said first output terminal of said second logic circuit to said output node of said second gate circuit includes a seventh insulated-gate field effect transistor of said first conductivity type, a gate electrode of said seventh transistor being supplied with said second clock signal.

4. A circuit comprising a power source having first and second terminals, a first clock-controlled gate circuit having an output node, a capacitor connected to said output node, a precharging circuit including serially connected first and second insulated-gate field effect transistors of a first conductivity type and connected between said first terminal of said power source and said output node, a third insulated-gate field effect transistor of a second conductivity type opposite to said first conductivity type, a source electrode of said third transistor being connected to said second terminal of said power source, a first logic circuit having an input terminal and first and second output terminals, means for connecting said first output terminal of said first logic circuit to said output node, and means for connecting said second output terminal of said first logic circuit to the drain electrode of said third transistor, a second clock-controlled gate circuit having an output node, a capacitor connected to said output node of said second gate circuit, a precharging circuit including serially connected fourth and fifth insulated-gate field effect transistors of said first conductivity type and connected between said first terminal of said power source and said output node of said second gate circuit, a sixth insulated-gate field effect transistor of said second conductivity type, the source electrode of said sixth transistor being connected to said second terminal of said power source, a second logic circuit having an input terminal and first and second output terminals, said input terminal of said second logic circuit being connected to said output node of said first gate circuit, means for connecting said first output terminal of said second logic circuit to said output node of said second gate circuit, and means for connecting said second output terminal of said second logic circuit to the drain electrode of said sixth transistor, means for applying a first clock signal having a first level at a first, a second and a third period, and a second level at a fourth, a fifth and a sixth period, said first level being effective to allow an insulated-gate field effect transistor of said first conductivity type to conduct, said second level being effective to allow an insulated-gate field effect transistor of said second conductivity type to conduct to the gate electrodes of said first and third transistors, means for applying a second clock signal having said first level at said third, fourth and fifth periods and said second level at said first, second and sixth periods to the gate electrodes of said second, fourth and sixth transistors, means for applying a third clock signal having said first level at said first, fifth and sixth periods and said second level at said second, third and fourth periods to the gate electrode of said fifth transistor.

5. A circuit according to claim 4, wherein said means for connecting said first output terminal of said first logic circuit to said output node of said first gate circuit includes a seventh insulated-gate field effect transistor of said second conductivity type, a gate electrode of said seventh transistor being supplied with said third clock signal.

6. A circuit according to claim 4, wherein said means for connecting said first output terminal of said second logic circuit to said output node of said second gate circuit includes a seventh insulated-gate field effect transistor of said second conductivity type, a gate electrode of said seventh transistor being supplied with said first clock signal.

7. A circuit comprising a power source having first and second terminals, a first clock-controlled gate circuit having an output node, a capacitor connected to said output node, a precharging circuit including serially connected first and second insulated-gate field effect transistors of a first conductivity type and connected between said first terminal of said power source and said output node, a third insulated-gate field effect transistor of a second conductivity type opposite to said first conductivity type, a source electrode of said third transistor being connected to said second terminal of said power source, a first logic circuit having an input terminal and first and second output terminals, means for connecting said first output terminal of said first logic circuit to said output node, and means for connecting said second output terminal of said first logic circuit to the drain electrode of said third transistor, a second clock-controlled gate circuit having an output node, a capacitor connected to said output node of said second gate circuit, a precharging circuit including serially connected fourth and fifth insulated-gate field effect transistors of said second conductivity type and connected between said second terminal of said power source and said output node of said second gate circuit, a sixth insulated-gate field effect transistor of said first conductivity type, the source electrode of said sixth transistor being connected to said first terminal of said power source, a second logic circuit having an input terminal and first and second output terminals, said input terminal of said second logic circuit being connected to said output node of said first gate circuit, means for connecting said first output terminal of said second logic circuit to said output node of said second gate circuit, and means for connecting said second output terminal of said second logic circuit to the drain electrode of said sixth transistor, means for applying a first clock signal having a first level at a first, a second and a third period and a second level at a fourth, a fifth and a sixth period, said first level being effective to allow an insulted-gate field effect transistor of said first conductivity type to conduct, said second level being effective to allow an insulated-gate field effect transistor of said second conductivity type of conduct to the gate electrodes of said first, third, fourth and sixth transistors, and means for applying a second clock signal having said first level at said third, fourth and fifth periods and said second level at said first, second and sixth periods to the gate electrodes of said second and fifth transistors.

8. A circuit according to claim 7, wherein said means for connecting said first output terminal of said first logic circuit to said output node of said first gate circuit includes a seventh insulated-gate field effect transistor of said second conductivity type, the gate electrode of said seventh transistor being connected to means for applying a third clock signal having said first level at said first, fifth and sixth periods and said second level at said second, third and fourth periods.

9. A circuit according to claim 7, wherein said means for connecting said first output terminal of said second logic circuit to said output node of said second gate circuit includes a seventh insulated-gate field effect transistor of said first conductivity type, the gate electrode of said seventh transistor being connected to means for applying a third clock signal having said first level at said first, fifth and sixth periods and said second level at said second, third and fourth periods.

* * * * *